United States Patent
Bensco

(10) Patent No.: US 12,112,971 B2
(45) Date of Patent: Oct. 8, 2024

(54) MULTI-ZONE SEMICONDUCTOR SUBSTRATE SUPPORTS

(71) Applicant: Applied Materials, Inc., Santa Clara, CA (US)

(72) Inventor: Ian Bensco, Mountain View, CA (US)

(73) Assignee: Applied Materials, Inc., Santa Clara, CA (US)

(*) Notice: Subject to any disclaimer, the term of this patent is extended or adjusted under 35 U.S.C. 154(b) by 313 days.

(21) Appl. No.: 17/200,080

(22) Filed: Mar. 12, 2021

(65) Prior Publication Data

US 2022/0293453 A1    Sep. 15, 2022

(51) Int. Cl.
*H01L 21/687* (2006.01)

(52) U.S. Cl.
CPC .. *H01L 21/68785* (2013.01); *H01L 21/68735* (2013.01)

(58) Field of Classification Search
None
See application file for complete search history.

(56) References Cited

U.S. PATENT DOCUMENTS

| | | | |
|---|---|---|---|
| 2005/0133164 A1* | 6/2005 | Fischer | H01L 21/68735 156/345.48 |
| 2018/0337074 A1* | 11/2018 | Choy et al. | H01L 21/67103 |
| 2019/0267218 A1* | 8/2019 | Wang | H01L 21/67109 |
| 2019/0385891 A1* | 12/2019 | Chang | C23C 16/4585 |
| 2021/0074524 A1 | 3/2021 | Koshimizu | |

FOREIGN PATENT DOCUMENTS

| | | |
|---|---|---|
| JP | 2014072355 A | 4/2014 |
| JP | 2019216176 A | 12/2019 |
| KR | 101248881 B1 | 4/2013 |
| KR | 20140101870 A | 8/2014 |
| KR | 20150013575 A | 2/2015 |
| KR | 20180126393 A | 11/2018 |
| TW | 202109591 A | 3/2021 |
| TW | 202121484 A | 6/2021 |

OTHER PUBLICATIONS

Application No. PCT/US2022/018431, International Search Report and Written Opinion, Mailed On Jun. 16, 2022, 10 pages.

* cited by examiner

*Primary Examiner* — Abbie E Quann
(74) *Attorney, Agent, or Firm* — Kilpatrick Townsend & Stockton LLP

(57) ABSTRACT

Exemplary support assemblies may include a top puck characterized by a first surface and a second surface opposite the first surface. The top puck may define a recessed ledge at an outer edge of the first surface of the top puck. The assemblies may include a cooling plate coupled with the top puck adjacent the second surface of the top puck. The assemblies may include a back plate coupled with the top puck about an exterior of the top puck. The back plate may at least partially define a volume with the top puck. The cooling plate may be housed within the volume. The assemblies may include a heater disposed on the recessed ledge of the top puck. The assemblies may include an edge ring seated on the heater and extending about the top puck. The edge ring may be maintained free of contact with the top puck.

18 Claims, 7 Drawing Sheets

MULTI-ZONE SEMICONDUCTOR SUBSTRATE SUPPORTS

TECHNICAL FIELD

The present technology relates to components and apparatuses for semiconductor manufacturing. More specifically, the present technology relates to substrate support assemblies and other semiconductor processing equipment.

BACKGROUND

Integrated circuits are made possible by processes which produce intricately patterned material layers on substrate surfaces. Producing patterned material on a substrate requires controlled methods for forming and removing material. The temperature at which these processes occur may directly impact the final product. Substrate temperatures are often controlled and maintained with the assembly supporting the substrate during processing. Temperature fluctuations that may occur across the surface or through the depth of the supporting assembly may create temperature zones or regions across a substrate. These regions of varying temperature may affect processes performed on or to the substrate, which may often reduce the uniformity of deposited films or etched structures along the substrate. Depending on the degree of variation along the surface of the substrate, device failure may occur due to the inconsistencies produced by the applications.

Additionally, many substrate supports may expose an edge region of the substrate or may include a pocket or edge ring that extends about the substrate. Etchant and deposition materials produced within the chambers may have disparate impacts on different regions of the substrate, and may have a pronounced effect at edge regions. As semiconductor processing continues to seek increases in useable area on a semiconductor wafer, maintaining uniformity into edge regions of the substrate may affect how much of the wafer may be used in fabrication.

Thus, there is a need for improved systems and methods that can be used to produce high quality devices and structures. These and other needs are addressed by the present technology.

SUMMARY

Exemplary support assemblies may include a top puck characterized by a first surface and a second surface opposite the first surface. The top puck may define a recessed ledge at an outer edge of the first surface of the top puck. The assemblies may include a cooling plate coupled with the top puck adjacent the second surface of the top puck. The assemblies may include a back plate coupled with the top puck about an exterior of the top puck. The back plate may at least partially define a volume with the top puck. The cooling plate may be housed within the volume. The assemblies may include a heater disposed on the recessed ledge of the top puck. The assemblies may include an edge ring seated on the heater and extending about the top puck. The edge ring may be maintained free of contact with the top puck.

In some embodiments, the top puck may define a thermal break between an interior zone and an exterior zone of the top puck. The thermal break may include a trench defined about an interior radius of the top puck. The thermal break may include a first trench defined about an interior radius of the top puck at the first surface of the top puck, and a second trench defined about a second interior radius of the top puck at the second surface of the top puck opposite the first surface. The edge ring may extend vertically above the first surface of the top puck at an outer radius of the edge ring. The edge ring may recess beneath the first surface of the top puck at an inner radius of the edge ring. The edge ring may be characterized by an outer diameter equal to an outer diameter of the top puck. The edge ring may include a skirt extending past an exterior edge of the heater. The heater may define an interior volume within which a heating element extends. The heating element may extend through the top puck into the heater. The heater may contact the top puck at two or more standoffs from the heater. One of the two or more standoffs may define an access for the heating element to extend into the heater. The one of the two or more standoffs may define a channel about the access. The heater may include a gasket seated within the channel about the access. The top puck may be or include aluminum or a ceramic. The edge ring may be or include nickel at least partially plated on the edge ring.

Some embodiments of the present technology may encompass substrate support assemblies. The assemblies may include a top puck characterized by a first surface and a second surface opposite the first surface. The top puck may define a recessed ledge at an outer edge of the first surface of the top puck. The assemblies may include a heater disposed on the recessed ledge of the top puck. The assemblies may include an edge ring seated on the heater and extending about the top puck. The edge ring may be maintained free of contact with the top puck.

In some embodiments, the top puck may define a plurality of recessed ledges at the outer edge of the first surface of the top puck. The heater may be seated on an outermost recessed ledge of the plurality of recessed ledges. The heater may extend vertically beyond an interior recessed ledge of the plurality of recessed ledges. The heater may define a recessed ledge at an interior edge of the heater. A channel may be formed between the recessed ledge of the heater and the interior recessed ledge of the plurality of recessed ledges of the top puck. The edge ring may extend within the channel. An interior edge of the edge ring may be disposed vertically recessed from the first surface of the top puck. The heater may define an interior volume within which a heating element extends. The heater may include a body defining an interior volume in which the heating element extends. The heater may include a lid coupled with the body. The heating element may be in direct contact with the lid about the heater.

Some embodiments of the present technology may encompass substrate support assemblies. The assemblies may include a top puck characterized by a first surface and a second surface opposite the first surface. The top puck may define a recessed ledge at an outer edge of the first surface of the top puck. The assemblies may include a heater disposed on the recessed ledge of the top puck. The heater may include a body defining an interior volume in which a heating element extends. The heater may include a lid coupled with the body. The heating element may be in direct contact with the lid about the heater. The assemblies may include an edge ring seated on the heater and extending about the top puck. The edge ring may be maintained free of contact with the top puck. In some embodiments, the heater may contact the top puck at two or more standoffs from the heater. One of the two or more standoffs may define an access for the heating element to extend into the heater. The one of the two or more standoffs may define a channel about the access. The heater may include a gasket seated within the channel about the access.

Such technology may provide numerous benefits over conventional systems and techniques. For example, by incorporating an additional heating element, supports according to some embodiments of the present technology may afford the ability to provide far edge temperature control on a substrate. Additionally, by having the heater as a separate component from the top puck, an increased temperature differential may be afforded between edge and interior zones of the substrate support. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

The present technology includes improved pedestal designs for heating and cooling distribution during semiconductor processing operations. While conventional pedestals may control the general temperature of the substrate during operations, the presently described technology allows for improved control of the temperature characteristics across the entirety of the surface and exterior of the pedestal. The technology allows for the pedestal to be controlled in multiple independent zones in a finite temperature range. In so doing, improved operations may be performed because a substrate residing on the pedestal can be maintained at a more uniform temperature profile across the entire surface. Additionally, by incorporating a specific edge ring heater as will be described below, far edge temperature control may be more independently controlled to limit far edge effects during semiconductor processing. These and other benefits will be explained in detail below.

Although the remaining disclosure will routinely identify specific etching processes utilizing the disclosed technology, it will be readily understood that the systems and methods are equally applicable to deposition and cleaning processes as may occur in the described chambers. Accordingly, the technology should not be considered to be so limited as for use with etching processes alone. The disclosure will discuss one possible system and chamber that can be used with the present technology to perform certain removal operations before additional variations and adjustments to this system according to embodiments of the present technology are described.

Figure 1:
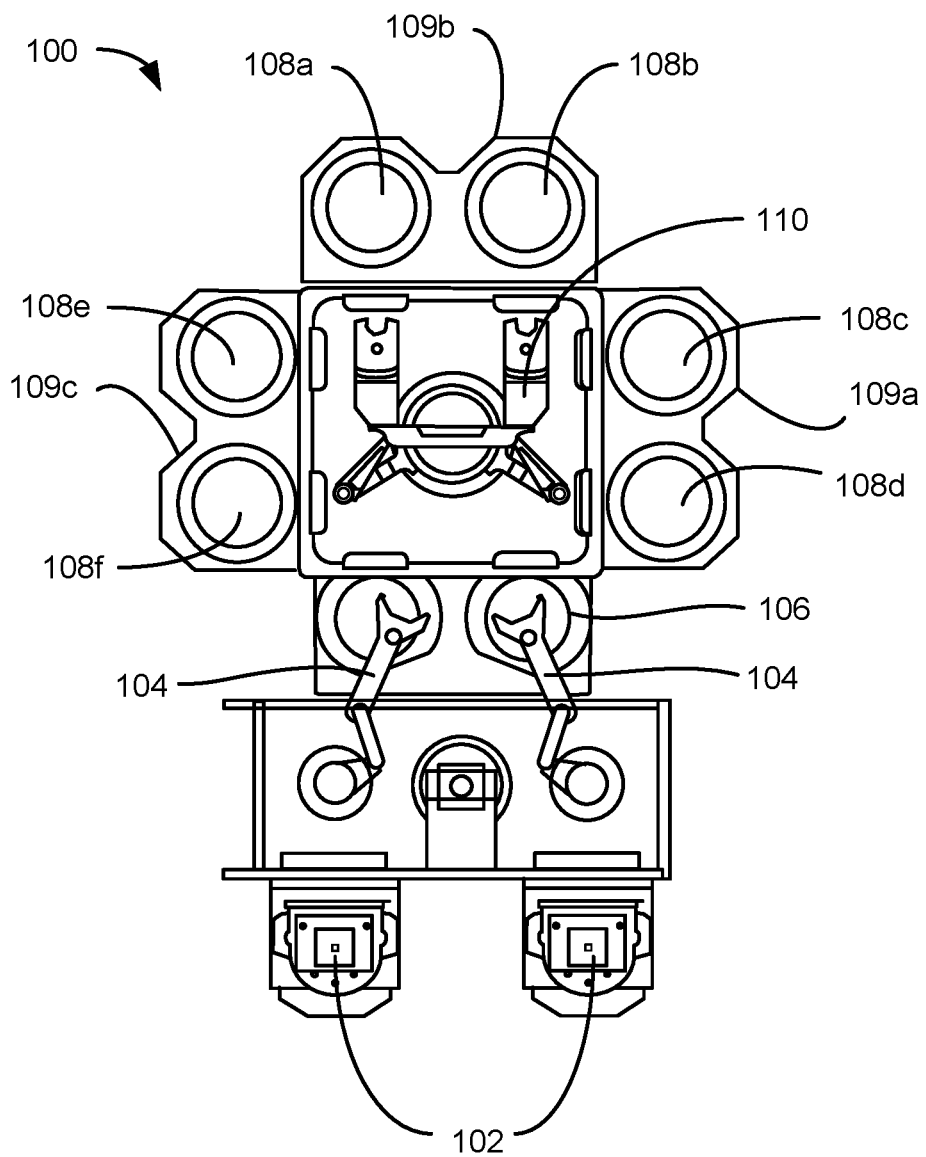
FIG. 1 shows a top plan view of an exemplary processing system according to some embodiments of the present technology.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including the dry etch processes described herein in addition to cyclical layer deposition, atomic layer deposition, chemical vapor deposition, physical vapor deposition, etch, pre-clean, degas, orientation, and other substrate processes.

The substrate processing chambers 108a-f may include one or more system components for depositing, annealing, curing and/or etching a dielectric film on the substrate wafer. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to etch a dielectric film on the substrate. Any one or more of the processes described may be carried out in chamber(s) separated from the fabrication system shown in different embodiments. It will be appreciated that additional configurations of deposition, etching, annealing, and curing chambers for dielectric films are contemplated by system 100.

Figure 2A:
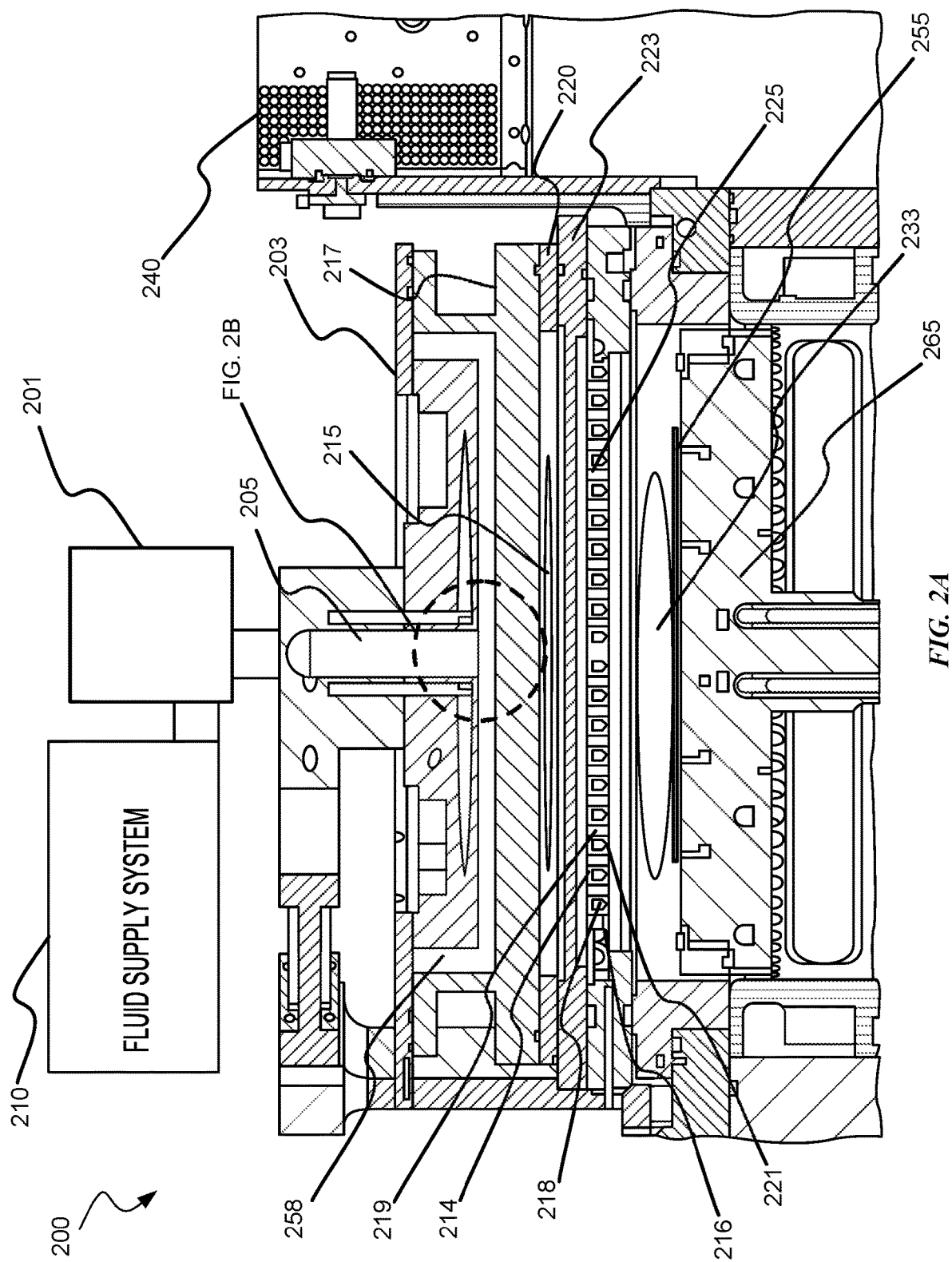
FIG. 2A shows a schematic cross-sectional view of an exemplary processing chamber according to some embodiments of the present technology.

FIG. 2A shows a cross-sectional view of an exemplary process chamber system 200 with partitioned plasma generation regions within the processing chamber. During film etching, e.g., titanium nitride, tantalum nitride, tungsten, silicon, polysilicon, silicon oxide, silicon nitride, silicon oxynitride, silicon oxycarbide, etc., a process gas may be flowed into the first plasma region 215 through a gas inlet assembly 205. A remote plasma system unit 201 may optionally be included in the system, and may process a first gas which then travels through gas inlet assembly 205. The inlet assembly 205 may include two or more distinct gas supply channels where the second channel may bypass the RPS 201, if included.

A cooling plate 203, faceplate 217, ion suppressor 223, showerhead 225, and a substrate support 265, having a substrate 255 disposed thereon, are shown and may each be included according to embodiments. The pedestal 265 may have a heat exchange channel through which a heat exchange fluid flows to control the temperature of the substrate, which may be operated to heat and/or cool the substrate or wafer during processing operations. The wafer support platter of the pedestal 265, which may comprise aluminum, ceramic, or a combination thereof, may also be resistively heated in order to achieve relatively high temperatures, such as from up to or about 100° C. to above or about 1100° C., using an embedded resistive heater element.

The faceplate 217 may be pyramidal, conical, or of another similar structure with a narrow top portion expanding to a wide bottom portion. The faceplate 217 may additionally be flat as shown and include a plurality of through-channels used to distribute process gases. Plasma generating gases and/or plasma excited species, depending on use of the RPS 201, may pass through a plurality of holes, shown in FIG. 2B, in faceplate 217 for a more uniform delivery into the first plasma region 215.

Exemplary configurations may include having the gas inlet assembly 205 open into a gas supply region 258 partitioned from the first plasma region 215 by faceplate 217 so that the gases/species flow through the holes in the faceplate 217 into the first plasma region 215.

Structural and operational features may be selected to prevent significant backflow of plasma from the first plasma region 215 back into the supply region 258, gas inlet assembly 205, and fluid supply system 210. The faceplate 217, or a conductive top portion of the chamber, and showerhead 225 are shown with an insulating ring 220 located between the features, which allows an AC potential to be applied to the faceplate 217 relative to showerhead 225 and/or ion suppressor 223. The insulating ring 220 may be positioned between the faceplate 217 and the showerhead 225 and/or ion suppressor 223 enabling a capacitively coupled plasma (CCP) to be formed in the first plasma region. A baffle (not shown) may additionally be located in the first plasma region 215, or otherwise coupled with gas inlet assembly 205, to affect the flow of fluid into the region through gas inlet assembly 205.

The ion suppressor 223 may comprise a plate or other geometry that defines a plurality of apertures throughout the structure that are configured to suppress the migration of ionically-charged species out of the first plasma region 215 while allowing uncharged neutral or radical species to pass through the ion suppressor 223 into an activated gas delivery region between the suppressor and the showerhead. In embodiments, the ion suppressor 223 may comprise a perforated plate with a variety of aperture configurations. These uncharged species may include highly reactive species that are transported with less reactive carrier gas through the apertures. As noted above, the migration of ionic species through the holes may be reduced, and in some instances completely suppressed. Controlling the amount of ionic species passing through the ion suppressor 223 may advantageously provide increased control over the gas mixture brought into contact with the underlying wafer substrate, which in turn may increase control of the deposition and/or etch characteristics of the gas mixture. For example, adjustments in the ion concentration of the gas mixture can significantly alter its etch selectivity, e.g., SiNx:SiOx etch ratios, Si:SiOx etch ratios, etc. In alternative embodiments in which deposition is performed, it can also shift the balance of conformal-to-flowable style depositions for dielectric materials.

The plurality of apertures in the ion suppressor 223 may be configured to control the passage of the activated gas, i.e., the ionic, radical, and/or neutral species, through the ion suppressor 223. For example, the aspect ratio of the holes, or the hole diameter to length, and/or the geometry of the holes may be controlled so that the flow of ionically-charged species in the activated gas passing through the ion suppressor 223 is reduced. The holes in the ion suppressor 223 may include a tapered portion that faces the plasma excitation region 215, and a cylindrical portion that faces the showerhead 225. The cylindrical portion may be shaped and dimensioned to control the flow of ionic species passing to the showerhead 225. An adjustable electrical bias may also be applied to the ion suppressor 223 as an additional means to control the flow of ionic species through the suppressor.

The ion suppressor 223 may function to reduce or eliminate the amount of ionically charged species traveling from the plasma generation region to the substrate. Uncharged neutral and radical species may still pass through the openings in the ion suppressor to react with the substrate. It should be noted that the complete elimination of ionically charged species in the reaction region surrounding the substrate may not be performed in embodiments. In certain instances, ionic species are intended to reach the substrate in order to perform the etch and/or deposition process. In these instances, the ion suppressor may help to control the concentration of ionic species in the reaction region at a level that assists the process.

Showerhead 225 in combination with ion suppressor 223 may allow a plasma present in first plasma region 215 to avoid directly exciting gases in substrate processing region 233, while still allowing excited species to travel from chamber plasma region 215 into substrate processing region 233. In this way, the chamber may be configured to prevent the plasma from contacting a substrate 255 being etched. This may advantageously protect a variety of intricate structures and films patterned on the substrate, which may be damaged, dislocated, or otherwise warped if directly contacted by a generated plasma. Additionally, when plasma is allowed to contact the substrate or approach the substrate level, the rate at which oxide species etch may increase. Accordingly, if an exposed region of material is oxide, this material may be further protected by maintaining the plasma remotely from the substrate.

The processing system may further include a power supply 240 electrically coupled with the processing chamber to provide electric power to the faceplate 217, ion suppressor 223, showerhead 225, and/or pedestal 265 to generate a plasma in the first plasma region 215 or processing region 233. The power supply may be configured to deliver an adjustable amount of power to the chamber depending on the process performed. Such a configuration may allow for a tunable plasma to be used in the processes being performed. Unlike a remote plasma unit, which is often presented with on or off functionality, a tunable plasma may be configured to deliver a specific amount of power to the plasma region 215. This in turn may allow development of particular plasma characteristics such that precursors may be dissociated in specific ways to enhance the etching profiles produced by these precursors.

A plasma may be ignited either in chamber plasma region 215 above showerhead 225 or substrate processing region 233 below showerhead 225. In embodiments, the plasma formed in substrate processing region 233 may be a DC biased plasma formed with the pedestal acting as an electrode. Plasma may be present in chamber plasma region 215 to produce the radical precursors from an inflow of, for example, a fluorine-containing precursor or other precursor. An AC voltage typically in the radio frequency range may be applied between the conductive top portion of the processing chamber, such as faceplate 217, and showerhead 225 and/or ion suppressor 223 to ignite a plasma in chamber plasma region 215 during deposition. An RF power supply may generate a high RF frequency of 13.56 MHz but may also generate other frequencies alone or in combination with the 13.56 MHz frequency.

Figure 2B:
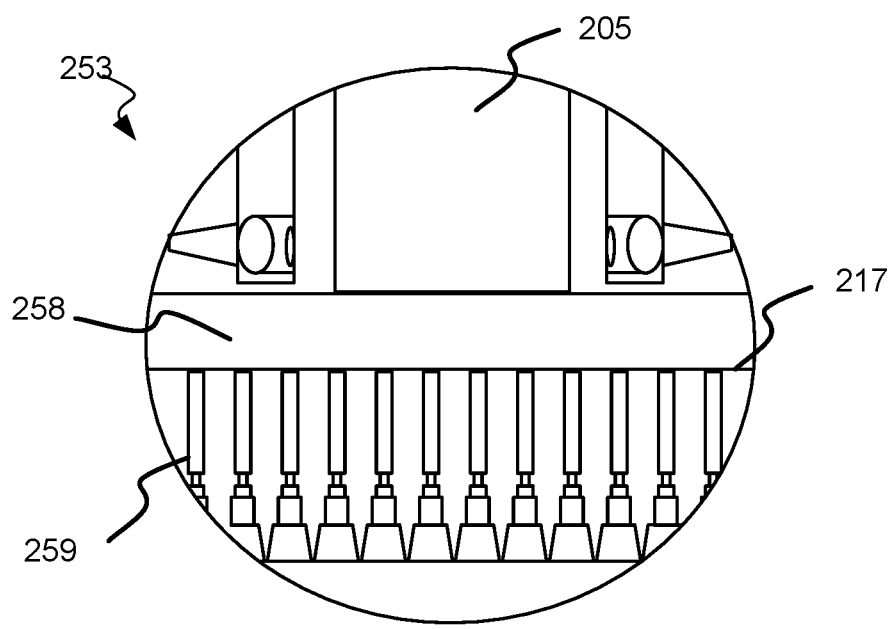
FIG. 2B shows a detailed view of an exemplary showerhead according to some embodiments of the present technology.

FIG. 2B shows a detailed view 253 of the features affecting the processing gas distribution through faceplate 217. As shown in FIGS. 2A and 2B, faceplate 217, cooling plate 203, and gas inlet assembly 205 intersect to define a gas supply region 258 into which process gases may be delivered from gas inlet 205. The gases may fill the gas supply region 258 and flow to first plasma region 215 through apertures 259 in faceplate 217. The apertures 259 may be configured to direct flow in a substantially unidirectional manner such that process gases may flow into processing region 233, but may be partially or fully prevented from backflow into the gas supply region 258 after traversing the faceplate 217.

Figure 3:
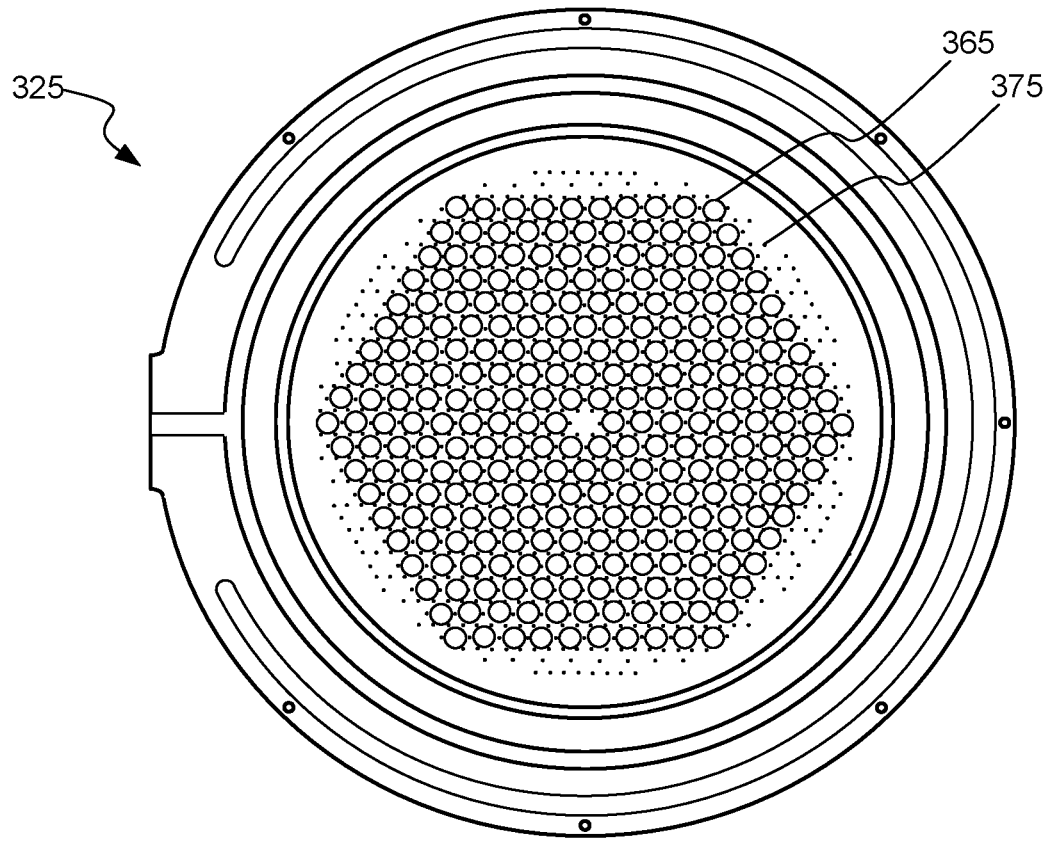
FIG. 3 shows a bottom plan view of an exemplary showerhead according to some embodiments of the present technology.

The gas distribution assemblies such as showerhead 225 for use in the processing chamber section 200 may be referred to as dual channel showerheads and are additionally detailed in the embodiments described in FIG. 3. The dual channel showerhead may provide for etching processes that allow for separation of etchants outside of the processing region 233 to provide limited interaction with chamber components and each other prior to being delivered into the processing region.

The showerhead 225 may comprise an upper plate 214 and a lower plate 216. The plates may be coupled with one another to define a volume 218 between the plates. The coupling of the plates may be so as to provide first fluid channels 219 through the upper and lower plates, and second fluid channels 221 through the lower plate 216. The formed channels may be configured to provide fluid access from the volume 218 through the lower plate 216 via second fluid channels 221 alone, and the first fluid channels 219 may be fluidly isolated from the volume 218 between the plates and the second fluid channels 221. The volume 218 may be fluidly accessible through a side of the gas distribution assembly 225.

FIG. 3 is a bottom view of a showerhead 325 for use with a processing chamber according to embodiments. Showerhead 325 may correspond with the showerhead 225 shown in FIG. 2A. Through-holes 365, which show a view of first fluid channels 219, may have a plurality of shapes and configurations in order to control and affect the flow of precursors through the showerhead 225. Small holes 375, which show a view of second fluid channels 221, may be distributed substantially evenly over the surface of the showerhead, even amongst the through-holes 365, and may help to provide more even mixing of the precursors as they exit the showerhead than other configurations.

Figure 4:
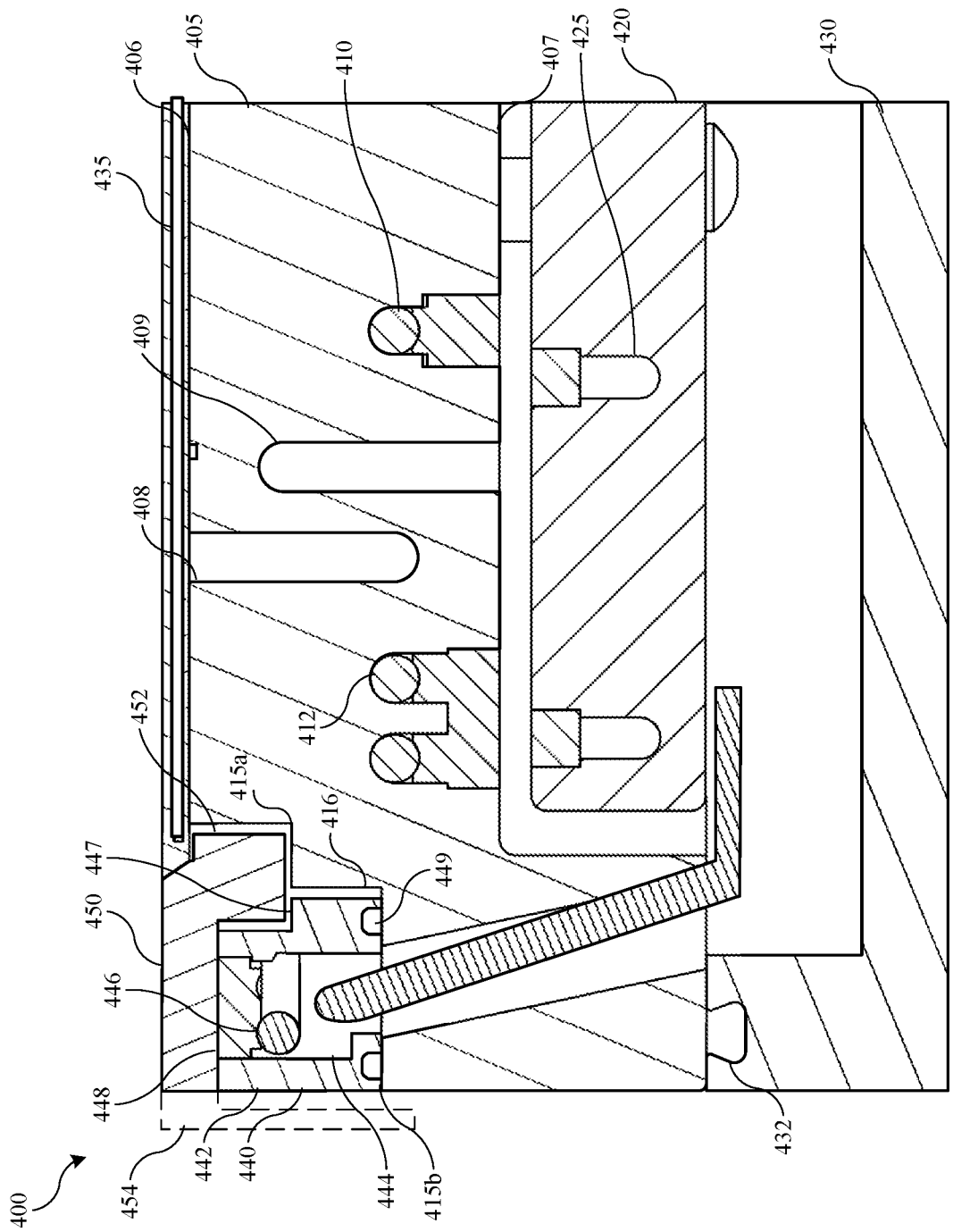
FIG. 4 shows a schematic partial cross-sectional view of an exemplary substrate support assembly according to some embodiments of the present technology.

FIG. 4 shows a schematic partial cross-sectional view of an exemplary substrate support assembly 400 according to some embodiments of the present technology. Substrate support assembly 400 may be similar to substrate support or pedestal 265 discussed previously, and may include some or all features discussed above with that structure. The illustration may show an edge region of the structure. As illustrated, the substrate support assembly 400 may include a top puck 405, a cooling plate 420, and a back plate 430. Back plate 430 may extend from a pedestal stem as previously illustrated, and may provide additional access for delivering fluid and/or electrical connections to various components of the substrate support assembly. For example, back plate 430 may be coupled with top puck 405 at an exterior region of the top puck, and which may produce a volume between the top puck 405 and the back plate 430, and within which the cooling plate may be housed. This interior volume may be maintained at higher pressure, such as up to atmospheric conditions, and thus the back plate 430 may define a channel 432 in which an o-ring may be seated for sealing the components against an external vacuum environment.

Top puck 405 may be characterized by a first surface 406 and a second surface 407 opposite the first surface, and from which a recess may be defined to receive cooling plate 420 as illustrated. Hence, when coupled together, the cooling plate may be coupled adjacent the second surface of the top puck. A gap as illustrated may be incorporated between the components in some embodiments, which may facilitate temperature control and provide a thermal break between the components. Top puck 405 may define one or more thermal breaks 408, 409 within the top puck 405, which may at least partially define one or more channels that can provide multiple temperature zones across the top puck and a substrate being supported. Top puck 405 may define any number of thermal breaks within the top puck 405, and may include at least or about 2, at least or about 3, at least or about 4, at least or about 5, at least or about 6, at least or about 7, at least or about 8, at least or about 9, at least or about 10, or more in embodiments. In some embodiments, such as illustrated in substrate support assembly 400, top puck 405 may define one or two thermal breaks. First thermal break 408 may be defined within first surface 406 of top puck 405, and may be characterized by a depth through top puck 405.

First thermal break 408 may be defined radially about top puck 405, and may be configured to at least partially divide top puck 405 into an interior zone and an exterior zone in embodiments. First thermal break 408 may be or include a trench defined about top puck 405 along an interior radius of the top puck. The depth of first thermal break 408 may be greater than half the thickness of top puck 405 in embodiments, and may be greater than or about 60%, greater than or about 70%, greater than or about 80%, greater than or about 90%, or equal to or about 100% of the thickness of top puck 405. In the case in which the trench fully bisects top puck 405, the interior zone and exterior zone may be two separate components individually coupled with back plate 430. First thermal break 408 may be configured to thermally isolate the interior zone and exterior zone in embodiments. Such isolation may allow the interior zone and the exterior zone to be separately heated or cooled during operation.

The thermal breaks may include multiple breaks, including a second thermal break 409, which may be defined in second surface 407 of top puck 405, or in a surface opposite the top surface or first surface 406. Second thermal break 409 may be defined at a second internal radius of top puck 405, which may be radially inward as shown or radially outward of first thermal break 408. Second thermal break 409 may be characterized by a second depth through top puck 405, which may be greater than, equal to, or less than a first depth of first thermal break 408. For example, as illustrated, second thermal break 409 may be characterized by a depth greater than a depth of first thermal break 408. Either or both of first thermal break 408 and second thermal break 409 may extend continuously or discontinuously about top puck 405. For example, first thermal break 408 may extend substantially continuously about top puck 405, but may have one or more connections, such as minimally thick extensions, at a bottom region across the first thermal break 408 to couple the interior zone to the exterior zone of top puck 405, which may allow a one-piece design of top puck 405. Second thermal break 490, may also be a continuous channel about the top puck, or may have sections about a radius of the trench in which the trench is not formed through top puck 405.

A benefit of multiple thermal breaks is that a thermal break defined from a top surface and a thermal break defined from a bottom surface may help to reduce crosstalk between the two zones, which may allow even more fine-tune temperature adjustments between the zones. Top puck 405 may be composed of any number of materials, and in embodiments, may be or include an aluminum material. Top puck 405 may be any type of aluminum, including a coated or plated aluminum. For example, top puck 405 may be a nickel or titanium coated aluminum in embodiments, which may protect top puck 405 from etching.

Additionally within the second surface of the top puck 405, one or more channels or recesses may be formed to receive a first heater 410. Any type of heater may be incorporated in embodiments of the present technology. For example, a coil heater may be seated in a channel defined in a spiral or other pattern about the top puck, which may provide more uniform heating of the top puck, and which may be maintained within the channel with a cover plate as shown. A second heater 412 may also be incorporated in an outer region of the top puck, and which may provide additional temperature control at the exterior region of the substrate relative to the interior region controlled by first heater 410, and separated by the thermal breaks as discussed above.

Heater 410 and/or heater 412 may include any type of resistive heater or a fluid heater in embodiments. The first heater 410 and the second heater 412 may be operated independently of one another, and may be capable of adjusting temperatures across the top puck 405, as well as a substrate residing on the top puck 405. Each heater may have a range of operating temperatures extending above or about 25° C., and each heater may be configured to heat above or about 50° C., above or about 60° C., above or about 70° C., above or about 80° C., above or about 90° C., above or about 100° C., above or about 125° C., above or about 150° C., above or about 175° C., above or about 200° C., above or about 250° C., above or about 300° C., above or about 350° C., above or about 400° C., above or about 500° C., above or about 600° C., above or about 700° C., or higher. The heaters may also be configured to operate in any range encompassed between any two of these stated numbers, or smaller ranges encompassed within any of these ranges.

The first heater 410 and the second heater 412 may also be configured to operate within a temperature range of one another, and configured to maintain a specific temperature across the surface of the top puck 405 or a substrate residing on top puck 405. For example, first heater 410 may be configured to operate to maintain the interior zone at a first temperature, and second heater 412 may be configured to operate to maintain the exterior zone at a second temperature similar to or different from the first. Each temperature of either the heater or the zone may be any temperature stated or included above, which may allow the two heaters to operate at a difference of tens or hundreds of degrees. Additionally, the difference between the operating temperature of the two heaters, or the maintained temperature of the interior zone and the exterior zone, may be less than 10° C. in embodiments. The temperature difference between the two heaters or maintained by the two zones may also be less than or about 5° C., less than or about 4° C., less than or about 3° C., less than or about 2° C., less than or about 1° C., less than or about 0.9° C., less than or about 0.8° C., less than or about 0.7° C., less than or about 0.6° C., less than or about 0.5° C., less than or about 0.4° C., less than or about 0.3° C., less than or about 0.2° C., less than or about 0.1° C., or less in embodiments. By allowing such minute temperature differences between the two zones, temperature fluctuations occurring due to precursor flow across a substrate, interference from other chamber components, reactions or operations occurring in one zone but not another based on a fabrication step, and other fluctuation sources may be controlled or overcome during operation. This may allow improved uniformity across the zones and across a substrate being processed compared to conventional technology.

Cooling plate 420 may define one or more channels 425 within cooling plate 420. Channels 425 may be configured to distribute one or more temperature controlled fluids about cooling plate 420. Channel 425 may be accessed from a central port at a central or interior region of the cooling plate, which may be accessible from a stem of the substrate support assembly. A cooling fluid may be delivered up the stem and into the central port, which may then allow the fluid to flow about channel 425. Channel 425 may be in any number of geometric patterns, such as a spiral or coil, as well as substantially concentric circles about the cooling plate 420. The pattern may extend to an exterior of the cooling plate before returning to an exit port, which may also be located at a central region of the cooling plate, and may provide access to additional channels or couplings within the stem of the pedestal, to allow return of the fluid to a heat exchanger or other apparatus for cooling and recirculation. As illustrated, cooling plate 420 may not fully extend to the recessed section of top puck 405, and may maintain a gap or volume between the components, which may limit or prevent excessive thermal communication between the cooling plate 420 and top puck 405.

Top puck 405 may define one or more recessed ledges 415 about an exterior radius of the top puck 405. Recessed ledges 415 may extend or step down towards an edge of top puck 405, which may be characterized by an outer diameter similar to or equal to an outer diameter of back plate 430. Two recessed ledges 415 are illustrated in FIG. 4, although the top puck 405 may define any number of recessed ledges in embodiments of the present technology. As illustrated, a first recessed ledge 415*a* and a second recessed ledge 415*b* are defined in top puck 405, and second recessed ledge 415*b* may extend to an exterior edge of top puck 405 as a separate recess extending from first recessed ledge 415*a*. The recessed ledges may extend from any radius along the top puck, and in some embodiments as illustrated, first recessed ledge 415*a* may extend at a radius less than a radius of a substrate seated on the top puck. As illustrated, substrate 435 may be seated on first surface 406 of the top puck, and may extend a radial distance along the top puck that extends past the edge of the recess of recessed ledge 415*a*. As will be explained further below, this may allow an edge ring to extend beneath the substrate in some embodiments of the present technology.

Seated on the recessed ledges 415 may be one or more components. For example, in some embodiments an edge ring heater 440 may be seated on one of the recessed ledges, such as recessed ledge 415b as illustrated. Edge ring heater 440 may be an annulus, and may extend about the top puck. In some embodiments, edge ring heater 440 may be characterized by an annular thickness that is less than or about the lateral length of the recessed ledge on which it is seated. Accordingly, in some embodiments, edge ring heater 440 may be maintained radially offset from an interior wall 416 of the top puck defining the recessed ledge 415b, which may reduce or limit conductive heat transfer from the heater to the top puck. As will be explained below, edge ring heater 440 may also include or define one or more standoffs further limiting contact between the edge ring heater and the top puck. Heater 440 may include a body 442 defining an interior volume or channel 444 extending about the heater, and which may house a heating element 446 that may extend about the heater to provide uniform heating from the heater. Heating element 446 may be a coil as illustrated, which may extend any number of times about the heater, including once, twice, three times, or more, although any other type of heating element may be included in embodiments according to the present technology.

A lid 448 may be sealed, brazed, welded, or otherwise coupled with the body 442, which may seal the heater volume in some embodiments. Heating element 446 may be in contact with lid 448 about the heater, which may facilitate directing heat upward to the edge ring in some embodiments. Additionally, the heating element 446 may not contact body 442 in some embodiments to further limit heat delivery to the top puck. Heating element 446 may extend through an aperture defined through the top puck 405 as illustrated, and may extend to the volume defined by the back plate 430, where the element may extend to the pedestal stem, where electrical connections may extend from the chamber. Additionally, a connector may extend through the pedestal stem, back plate, and top puck, where the connector may electrically couple with the heating element 446. Any other type of couplings may be encompassed by embodiments of the present technology. As noted above, edge ring heater 440 may include one or more standoffs that may contact recessed ledge 415b to limit contact with the top puck. One such standoff may be coupled with or defined at a location where heating element 446 or a connector may extend through the heater and the top puck. As illustrated, an annular protrusion may extend about the access or aperture through the top puck 405. The protrusion or standoff may define a channel 449 in which an o-ring, gasket, or elastomeric element may be seated, and which may seal the connection from a vacuum environment in the processing chamber.

As illustrated, edge ring heater 440 may be seated on an outermost recessed ledge, such as recessed ledge 415b, and may extend vertically beyond an interior recessed ledge, such as recessed ledge 415a. As illustrated, the heater may not extend vertically past the first surface 406 of the top puck in some embodiments. Along an interior edge, such as an inner annular edge, the edge ring heater 440 may define a recessed ledge 447, which may be in line with first recessed ledge 415a of the top puck. This may define a channel between the recessed ledge of the heater and the interior recessed ledge of the top puck, and the channel may extend about the substrate support.

The substrate support assembly may also include an edge ring 450 in some embodiments. Edge ring 450 may be seated on edge ring heater 440 as illustrated. The edge ring may extend about the top puck 405, although in some embodiments the edge ring may remain free of contact with the top puck, and may not contact the top puck at any location of the edge ring. Edge ring 450 may be a similar material or a different material from top puck 405, and in embodiments, edge ring 450 may include a nickel plated aluminum or other plated or coated aluminum, which may limit corrosion of the edge ring 520 during etching operations utilizing a halogen-containing precursor, for example. Coatings may include metal or alloys, such as including nickel, platinum, or any other metal or transition metal. Additionally, the coating may include any number of oxide or nitride materials, such as yttium oxide, aluminum oxide, or any other material that may limit an impact on the underlying aluminum, or may impact processing conditions to control etching, plasma generation, or chamber component degradation. Additionally, edge ring 450 may be only partially plated with nickel as will be further explained below, such as where interior surfaces of the edge ring, including the shoulder as noted below, may be aluminum exposed from beneath nickel plating. Because nickel may impact etching, and may halt etching at locations proximate the nickel due to an affinity of etch materials to nickel, by exposing aluminum along regions proximate the substrate, edge etching or processing may be performed.

Edge ring 450 may extend about the top puck along recessed ledges 415, and may extend vertically above top puck 405 in embodiments so as to extend vertically above a top plane or first surface 406 of the top puck 405, such as at an outer radius of the edge ring. Edge ring 450 may be characterized by an inner edge, which may be sloped from the outer edge beneath first surface 406 of the top puck at a shoulder 452 of the edge ring extending towards top puck 405. As illustrated, shoulder 452 may extend within the channel formed between the interior recessed ledge of the edge ring heater and the recessed ledge 415a of the top puck. Shoulder 452, extending to an interior edge, such as an inner annular wall of the edge ring, may extend to a position vertically recessed from the first surface 406 of top puck 405. Additionally, an inner annular wall of the edge ring may extend to an interior radius that is beyond an outer radial edge of a substrate, such as substrate 435 as illustrated.

Accordingly, edge ring 450 may extend directly beneath a substrate being processed without contacting the substrate. Because the edge ring may be independently heated by the edge ring heater 440, temperature tuning of the substrate edge may be performed. Accordingly, impacts or effects from the edge ring on plasma processing at the substrate edge may be reduced or eliminated, and more uniform processing may be performed. Consequently, substrate supports according to some embodiments of the present technology may afford three zones of independent temperature control. Additionally, because the edge ring heater may have minimal contact with the top puck, and because the edge ring may not contact the top puck, an increased temperature differential may be produced between an edge region and other regions of the substrate, which may allow additional control to improve uniformity of processing on the substrate.

Edge ring 450 may be characterized by an outer diameter equal to or similar to an outer diameter of top puck 405, such that in some embodiments, edge ring 450 may not extend beyond an external radius of top puck 405. Additionally, in some embodiments edge ring 450 may include an optional skirt 454, shown in outline, which may be part of a singlepiece edge ring, and may extend vertically from the edge ring. The skirt may extend away from the heater 440 partly, and may not contact the heater as it extends past an exterior edge of the heater. The skirt may extend vertically past the heater and recessed ledge 415*b*, which may protect the gaps between the components from allowing plasma or other processing effluents from flowing between the components. As noted above, edge ring 450 may not contact top puck 405, which may allow a continuous spacing between each surface of top puck 405, including recessed ledges 415, and edge ring 450. A purge gas may be flowed through apertures through top puck 405 extending through recessed ledges 415, which may allow continuous purging from about the edge ring 450 and edge ring heater 440. Edge ring 450 may allow an amount of precursor flow from external edges of the chamber to be blocked to prevent or limit additional etching, deposition, or processing of edge regions of a substrate in some embodiments.

Figure 5A:
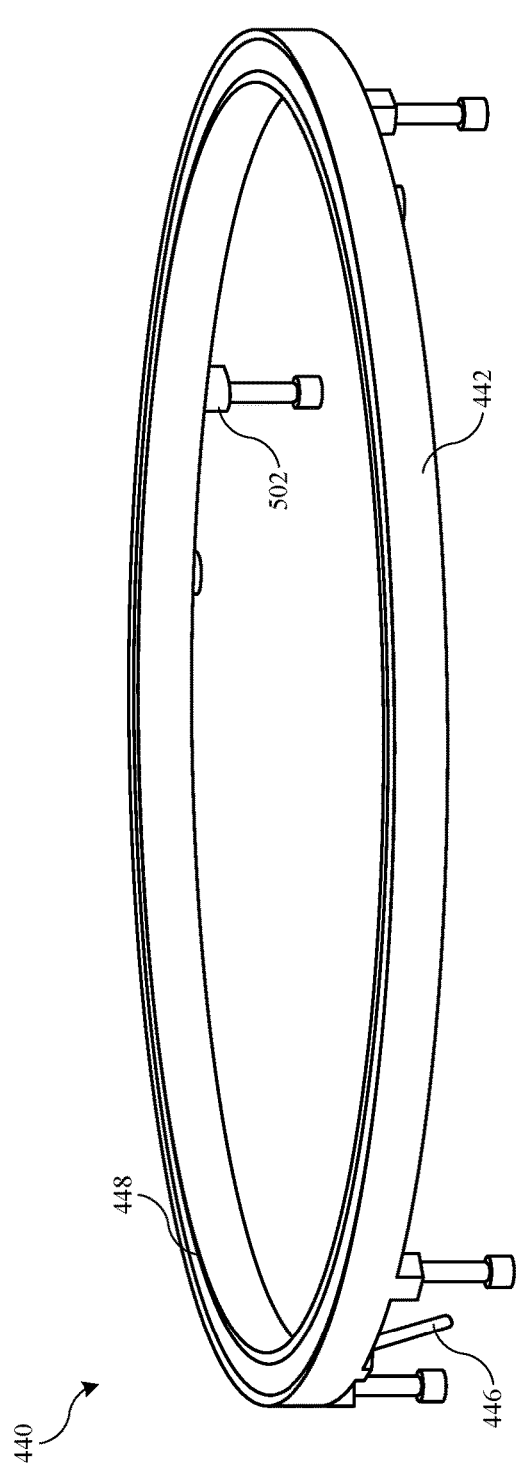
FIG. 5A shows a schematic top isometric view of an exemplary edge ring heater according to some embodiments of the present technology.
Figure 5B:
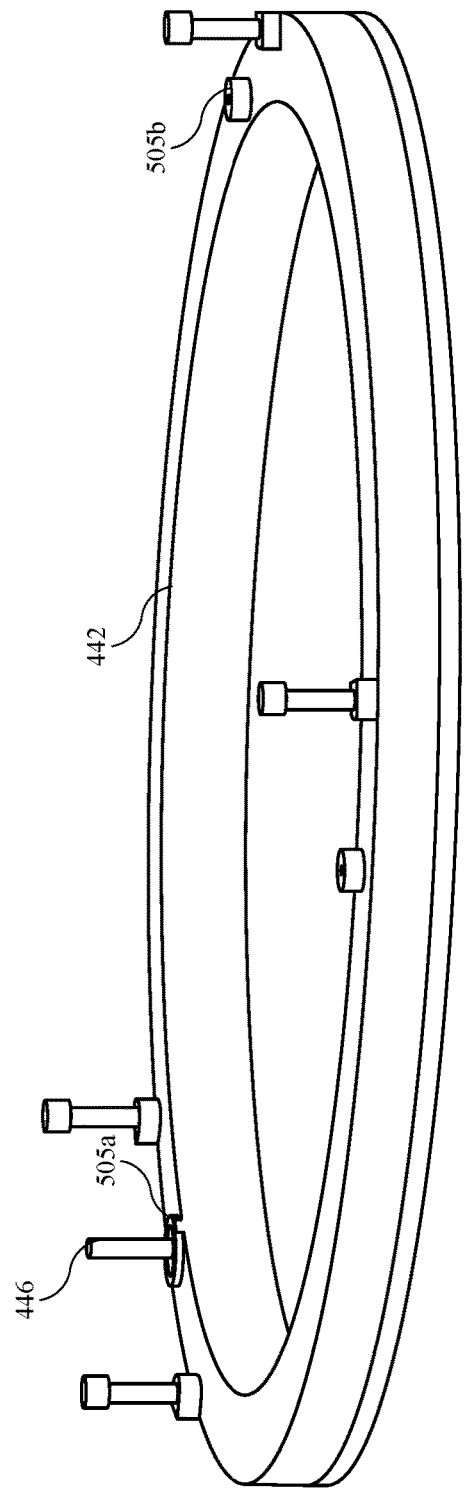
FIG. 5B shows a schematic bottom isometric view of an exemplary edge ring heater according to some embodiments of the present technology.

FIG. 5A shows a schematic top isometric view of an exemplary edge ring heater according to some embodiments of the present technology, and may illustrate additional aspects of edge ring heater 440, for example. As illustrated, edge ring heater 440 may include a body 442 and a lid 448 that extends about the heater to seal an interior volume in which a heating element may be disposed, although heating element 446 may extend from the heater body at a standoff location as discussed above. Heater body 442 may also include a number of protrusions 502, which may allow the heater to be bolted to the top puck while limiting contact with the top puck, as will be described further below. FIG. 5B shows a schematic bottom isometric view of an exemplary edge ring heater according to some embodiments of the present technology, and may also illustrate additional aspects of edge ring heater 440. As discussed above, heating element 446, or a connector, may extend through the heater body at a standoff 505 of the heater body. The heater body may include or define one, two, three, or more standoffs 505, although increasing standoffs may increase contact with the top puck, which may increase heat transfer between the components.

Standoff 505*a* may be a part of body 442, and may define a channel for a gasket to seal the access for the heating element as described above. Standoffs 505*b* may be located at regular or irregular intervals as illustrated, which may provide two, three, or more total points of contact along with standoff 505*a*. Standoffs 505*b* may be an insulating material, such as PEEK or some other material that may withstand the chamber environment. In some embodiments, all standoffs 505 may be the same material to increase heat transfer uniformity, and may be coupled with the body, such as standoffs 505*b*, or may be defined by the edge ring heater body 442, such as standoff 505*a*.

Figure 6:
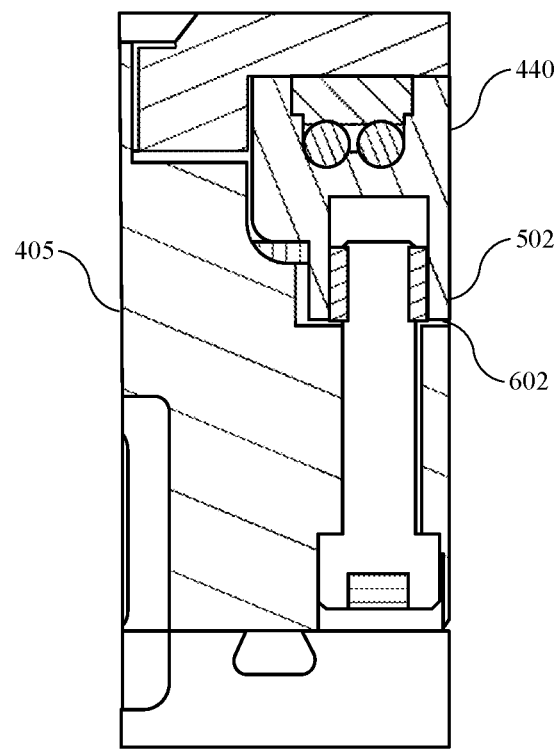
FIG. 6 shows a schematic partial cross-sectional view of an exemplary substrate support assembly according to some embodiments of the present technology.

FIG. 6 shows a schematic partial cross-sectional view of an exemplary substrate support assembly according to some embodiments of the present technology, and may show additional views of substrate support assembly 400 described above, and may illustrate an exemplary coupling between the edge ring and the top puck. As illustrated, top puck 405 may define one or more recesses to receive the protrusions 502 of heater 440. As shown, the protrusions may define a recess to receive a bolt or other coupling material that may extend through the top puck 405 to join the components. As shown, the bolt or coupler may be sized to maintain a gap 602 between the protrusion 502 and the top puck 405. For example, the recess may define a lock or stop in the heater, which may ensure the heater is maintained off the top puck, except for the standoffs as previously described. By incorporating an edge ring and edge ring heater according to some embodiments of the present technology, substrate edge temperature modulation may be performed, which may improve process uniformity across the substrate. For example, in operation, the edge ring heater may be set or may maintain the edge ring at any of the temperatures described above, which may be similar or different from either or both of the heaters in the top puck, which may allow three zones of temperature control. Because the edge ring may be maintained free of contact with the top puck, a temperature differential between the substrate edge and the interior and/or exterior zone of the substrate may be maintained at greater than or about 5° C., and may be maintained at greater than or about 10° C., greater than or about 20° C., greater than or about 30° C., greater than or about 40° C., greater than or about 50° C., or higher. Consequently, any edge effects from processing may be mitigated or prevented.

Figure 7A:
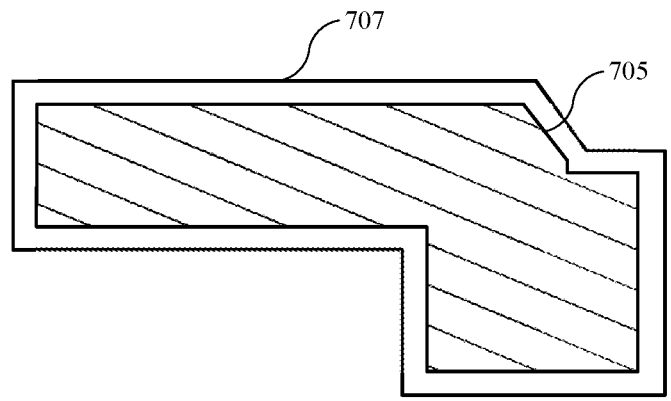
FIGS. 7A-7C show schematic partial cross-sectional views of an exemplary edge rings according to some embodiments of the present technology.
Figure 7B:
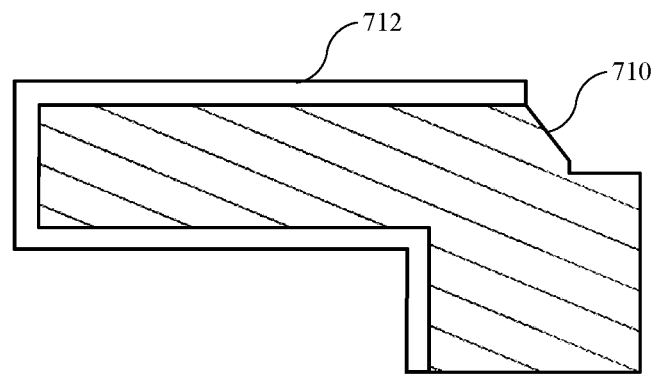
Figure 7C:
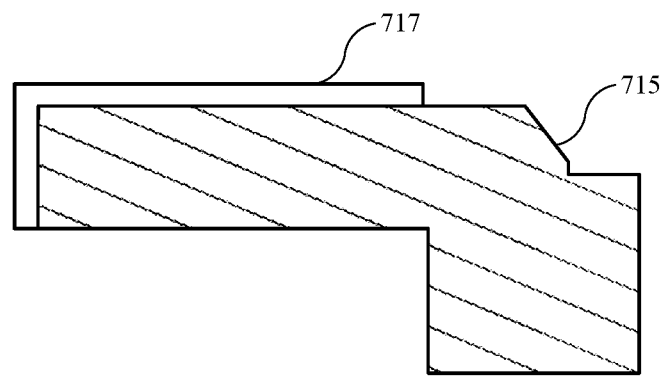

As explained previously, in some embodiments the edge ring may be plated, such as aluminum base with nickel, or other plating material, including any plating material previously noted. The plating may be a material characterized by a higher affinity with halogen radical materials, and/or any materials that may protect underlying materials. FIGS. 7A-7C illustrate exemplary partial cross-sections of edge rings, which may include any materials or aspects as previously described. The edge rings may show plating examples encompassed by the present technology, and which may be included on any edge ring and within any assembly or system previously described. By adjusting the amount of plating according to some embodiments, improved edge profiles may be achieved.

For example, FIG. 7A may illustrate a fully coated edge ring 705 according to some embodiments of the present technology. The coating 707 may be nickel or any other metal, including transition metals, as well as alloys. By including a coating, an adjustment to plasma processing may be afforded. For example, fluorine, or other halogens, may be characterized by a higher affinity to nickel than to other materials, including aluminum. Accordingly, during processing, the nickel may draw fluorine or other halogen radical species from the edge of the substrate being processed towards the edge ring. For processes for which increased edge etching may occur, such a coating may reduce edge effects improving uniformity.

However, the nickel may in some embodiments essentially nullify edge etching depending on the proximity of the nickel to the substrate. Accordingly, in some embodiments a portion of the nickel may be removed or not formed, which may expose underlying aluminum or other materials. FIG. 7B illustrates an exemplary edge ring 710, which may have a partial coating 712. Some or all of the shoulder portion of the edge ring, which may be in closest proximity to the substrate, may have the plating removed or not formed. The exposed aluminum may allow more etchant materials to interact with the substrate, and may allow edge etching to occur.

FIG. 7C illustrates an exemplary edge ring 715, which may have a partial coating 717, which may be a more reduced coating from that shown in FIG. 7B. It is to be understood that any amount of coating may be included, which may expose any amount of the edge ring. As illustrated, the coating may be limited to exterior edge regions of the edge ring as shown, which may limit any interaction with the substrate, while allowing protection of the outer edge of the edge ring. Additionally, in some embodiments the coating may not be included along a backside of the edge ring, which may be in contact with the heater. Because the heater housing may also be aluminum, removing the coating may ensure a similar expansion of the materials during heating, which may ensure the edge ring maintains consistent contact with the heater, and may not shift in position. By including some amount of plating, the edge ring may be better protected from plasma effluents, although by exposing at least a portion of the underlying aluminum, edge etching may be maintained on the substrate.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a layer" includes a plurality of such layers, and reference to "the precursor" includes reference to one or more precursors and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A substrate support assembly comprising:
a top puck characterized by a first surface and a second surface opposite the first surface, wherein the top puck defines a recessed ledge at an outer edge of the first surface of the top puck;
a cooling plate coupled with the top puck adjacent the second surface of the top puck;
a back plate coupled with the top puck about an exterior of the top puck, wherein the back plate at least partially defines a volume with the top puck, and wherein the cooling plate is housed within the volume;
a heater disposed on the recessed ledge of the top puck, wherein:
the heater defines an interior volume within which a heating element extends; and
the heating element extends through the top puck into the heater; and
an edge ring seated on the heater and extending about the top puck, wherein the edge ring is maintained free of contact with the top puck.

2. The substrate support assembly of claim 1, wherein the top puck defines a thermal break between an interior zone and an exterior zone of the top puck, and wherein the thermal break comprises a trench defined about an interior radius of the top puck.

3. The substrate support assembly of claim 2, wherein the trench comprises a first trench defined about an interior radius of the top puck at the first surface of the top puck, and the thermal break comprises a second trench defined about a second interior radius of the top puck at the second surface of the top puck opposite the first surface.

4. The substrate support assembly of claim 1, wherein the edge ring extends vertically above the first surface of the top puck at an outer radius of the edge ring.

5. The substrate support assembly of claim 4, wherein the edge ring recesses beneath the first surface of the top puck at an inner radius of the edge ring.

6. The substrate support assembly of claim 1, wherein the edge ring is characterized by an outer diameter equal to an outer diameter of the top puck.

7. The substrate support assembly of claim 1, wherein the edge ring comprises a skirt extending past an exterior edge of the heater.

8. The substrate support assembly of claim 1, wherein the heater contacts the top puck at two or more standoffs from the heater, wherein one of the two or more standoffs defines an access for the heating element to extend into the heater, and wherein the one of the two or more standoffs defines a channel about the access, the heater further comprising:
a gasket seated within the channel about the access.

9. The substrate support assembly of claim 1, wherein the top puck comprises aluminum or a ceramic, and wherein the edge ring comprises nickel at least partially plated on the edge ring.

10. A substrate support assembly comprising:
a top puck characterized by a first surface and a second surface opposite the first surface, wherein the top puck defines a recessed ledge at an outer edge of the first surface of the top puck;
a heater disposed on the recessed ledge of the top puck;
a plurality of thermally insulating standoffs that are positioned between the heater and the top puck and that space the heater apart from the top puck; and
an edge ring seated on the heater and extending about the top puck, wherein the edge ring is maintained free of contact with the top puck.

11. The substrate support assembly of claim 10, wherein the top puck defines a plurality of recessed ledges at the outer edge of the first surface of the top puck.

12. The substrate support assembly of claim 11, wherein the heater is seated on an outermost recessed ledge of the plurality of recessed ledges, and wherein the heater extends vertically beyond an interior recessed ledge of the plurality of recessed ledges.

13. The substrate support assembly of claim 12, wherein the heater defines a recessed ledge at an interior edge of the heater, and wherein a channel is formed between the recessed ledge of the heater and the interior recessed ledge of the plurality of recessed ledges of the top puck.

14. The substrate support assembly of claim 13, wherein the edge ring extends within the channel, and wherein an interior edge of the edge ring is disposed vertically recessed from the first surface of the top puck.

15. The substrate support assembly of claim 10, wherein the heater defines an interior volume within which a heating element extends.

16. The substrate support assembly of claim 15, wherein the heater comprises: a body defining the interior volume in which the heating element extends, and a lid coupled with the body, wherein the heating element is in direct contact with the lid about the heater.

17. A substrate support assembly comprising:
- a top puck characterized by a first surface and a second surface opposite the first surface, wherein the top puck defines a recessed ledge at an outer edge of the first surface of the top puck;
- a heater disposed on the recessed ledge of the top puck, wherein the heater comprises:
  - a body defining an interior volume in which a heating element extends, and
  - a lid coupled with the body, wherein the heating element is in direct contact with the lid about the heater; and
- an edge ring seated on the heater and extending about the top puck, wherein the edge ring is maintained free of contact with the top puck.

18. The substrate support assembly of claim 17, wherein the heater contacts the top puck at two or more standoffs from the heater, wherein one of the two or more standoffs defines an access for the heating element to extend into the heater, and wherein the one of the two or more standoffs defines a channel about the access, the heater further comprising:
- a gasket seated within the channel about the access.

* * * * *